(12) United States Patent
Tan et al.

(10) Patent No.: US 7,926,000 B2
(45) Date of Patent: Apr. 12, 2011

(54) INTEGRATED CIRCUIT SYSTEM EMPLOYING DIPOLE MULTIPLE EXPOSURE

(75) Inventors: Sia Kim Tan, Singapore (SG); Qunying Lin, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 624 days.

(21) Appl. No.: 11/683,691

(22) Filed: Mar. 8, 2007

(65) Prior Publication Data
US 2008/0217726 A1 Sep. 11, 2008

(51) Int. Cl.
G06F 17/50 (2006.01)
(52) U.S. Cl. ............ 716/19; 716/21; 430/311; 430/394; 430/396; 250/492.2
(58) Field of Classification Search .................... 716/19, 716/21; 430/311, 394, 396; 250/492.2
See application file for complete search history.

(56) References Cited

U.S. PATENT DOCUMENTS

| | | | |
|---|---|---|---|
| 6,553,562 B2 | 4/2003 | Capodieci et al. | |
| 6,855,486 B1 | 2/2005 | Finders et al. | |
| 7,033,734 B2 | 4/2006 | Chandhok | |
| 2003/0085360 A1* | 5/2003 | Parker et al. | 250/396 R |
| 2004/0021845 A1* | 2/2004 | Kawahara | 355/67 |
| 2004/0104359 A1* | 6/2004 | Komatsuda et al. | 250/492.2 |
| 2005/0005257 A1* | 1/2005 | Eurlings et al. | 716/21 |
| 2005/0221233 A1* | 10/2005 | Minvielle et al. | 430/313 |
| 2006/0240331 A1 | 10/2006 | O'Brien et al. | |
| 2009/0212213 A1* | 8/2009 | Nakasuji et al. | 250/310 |

* cited by examiner

*Primary Examiner* — Eugene Lee
(74) *Attorney, Agent, or Firm* — Mikio Ishimaru

(57) ABSTRACT

An integrated circuit system that includes: providing a first mask including a first feature; exposing the first mask to a radiation source to form an image of the first feature on a photoresist material that is larger than a structure to be formed, the photoresist material being formed over a substrate that includes the integrated circuit system; providing a second mask including a second feature; aligning the second mask over the image of the first mask to form an overlap region; and exposing the second mask to the radiation source to form an image of the second feature on the photoresist material that is larger than the structure to be formed.

10 Claims, 5 Drawing Sheets

INTEGRATED CIRCUIT SYSTEM EMPLOYING DIPOLE MULTIPLE EXPOSURE

TECHNICAL FIELD

The present invention relates generally to integrated circuits, and more particularly to an integrated circuit system employing dipole multiple exposure.

BACKGROUND ART

Modern photolithography equipment is based on optical lithography, which uses optics to accurately project and expose a reticle or mask pattern on a photoresist-covered wafer. Photolithography is an important part of the wafer fabrication process, and by some estimates may consume up to sixty percent of the wafer's fabrication time. Photolithography has been widely used in the semiconductor industry for more than fifty years to form a wide range of structures, such as vias, conductive lines, and other structures commonly present in integrated circuit devices. Integrated circuits are what power many of today's consumer electronics and they can be found in cellphones, video cameras, portable music players, computers, and even automobiles.

Generally, the photolithography process and its corresponding equipment consist of a light source transmitted through an optical system onto a reticle or mask with a pattern. The pattern produced by the light is then aligned to a wafer covered with a light-sensitive photoresist by an alignment system, wherein the pattern is then transferred to the photoresist.

More specifically, the photolithography process can begin with the formation of a photoresist layer on or over the top surface of a semiconductor substrate or wafer. A reticle or mask with a circuit design or pattern defined by opaque regions, which are often formed of chrome, and clear regions, which are often formed of silica, is then positioned over the photoresist coated wafer. Commonly, multiple reticles or mask patterns are employed to attain the final circuit pattern on the wafer surface.

Each one of the masks or reticles is placed between a light source and a projection lens system. The pattern produced by the light transmitted through the mask or reticle is then focused to generate a reduced mask image on the wafer. The focusing and reduction of the mask image pattern is typically done using the projection lens system, which contains one or more lenses, filters, and/or mirrors. The light passing through the clear regions of the reticle or mask exposes the underlying photoresist layer and depending upon the photoresist layer composition, the exposed portions of the photoresist can either become soluble or insoluble to a subsequent developer. This patterned photoresist layer is then used to remove or further process exposed portions of underlying structural layers within the wafer. The end result is a semiconductor wafer coated with a photoresist layer exhibiting a desired pattern, which defines geometries, features, lines and shapes of the reticle or mask pattern.

The resolution achieved through photolithography depends, in part, on the wavelength and coherence of the light source, as well as, the numerical apertures (NA) of the lens within the photolithography system. As the critical dimension geometry of each new successive integrated circuit generation decreases, the resolution (i.e.—the ability to discretely discern pairs of closely spaced features on a wafer) of the corresponding photolithographic equipment must also improve. Although, the resolution of photolithographic equipment can be improved by using a lens with a higher NA, it unfortunately comes at a cost because the depth of focus of a lens is inversely proportional to the square of the NA. Consequently, improving the resolution of a system by increasing the NA reduces the depth of focus of the system. Poor depth of focus will cause some features of the wafer to be out of focus, which leads to poor exposure of the wafer to the reticle image pattern. Thus, proper design of any photolithography equipment must consider the compromise between resolution and depth of focus.

Commonly, photolithographic equipment is called upon to form a square contact hole from a square feature, but as photolithography equipment expands into the sub-wavelength realm, a circular contact hole is frequently formed by the square feature due to the corner-rounding effect at each corner. Furthermore, as the critical dimensions of these square contact holes or circular contacts holes continues to decrease, the dimensions of the square features forming them become too small to transmit the energy needed to fully expose the photoresist. Consequently, the square features are sized up on design to permit the transmission of the necessary energy to fully expose the photoresist. But, due to the physical constraints imposed by lens manufacturing capabilities, the size up of these square features has a finite limit and such size up accommodations have their limits as the technology node for integrated circuit design continues to decrease to meet consumer demand.

Advanced photolithography has made use of optical enhancement techniques, such as, phase shifting masks and optical proximity correction methods to improve the resolution of smaller features as the technology node continues to shrink. But these techniques also have their limits as the technology node for integrated circuit design continues to decrease.

Thus, a need still remains for a reliable integrated circuit system and method of fabrication, wherein the integrated circuit system exhibits enhanced pattern resolution. In view of the ever-increasing commercial competitive pressures, increasing consumer expectations, and diminishing opportunities for meaningful product differentiation in the marketplace, it is increasingly critical that answers be found to these problems. Moreover, the ever-increasing need to save costs, improve efficiencies, and meet such competitive pressures adds even greater urgency to the critical necessity that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit system including: providing a first mask including a first feature; exposing the first mask to a radiation source to form an image of the first feature on a photoresist material that is larger than a structure to be formed, the photoresist material being formed over a substrate that includes the integrated circuit system; providing a second mask including a second feature; aligning the second mask over the image of the first mask to form an overlap region; and exposing the second mask to the radiation source to form an image of the second feature on the photoresist material that is larger than the structure to be formed.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
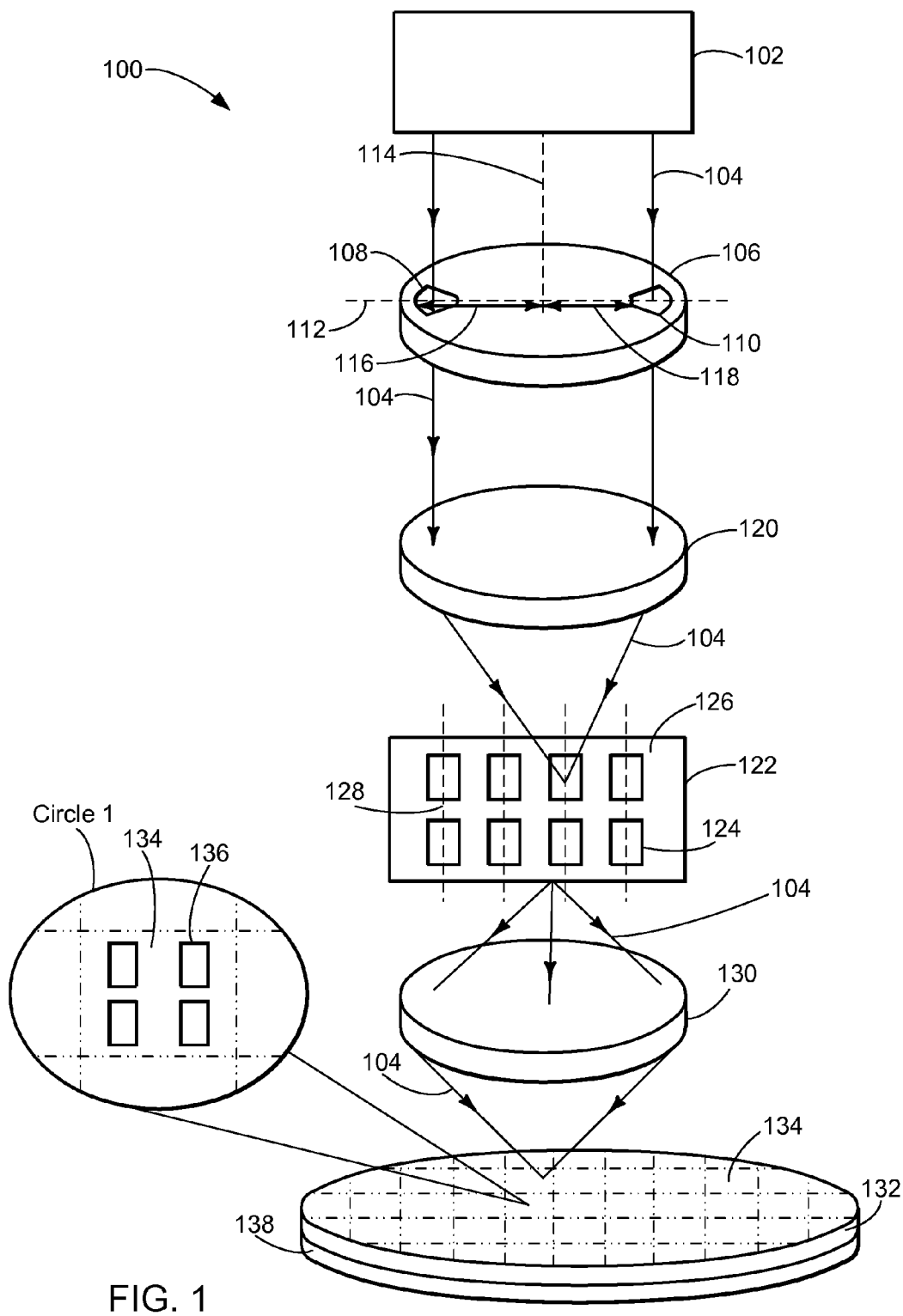
FIG. 1 is an isometric view of the basic elements of a photolithography system used to image a structure by dipole illumination in accordance with an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown exaggerated in the drawing FIGs. Additionally, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the substrate, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processed" or "processing" as used herein includes deposition of material or photoresist, patterning, exposure, development, etching, cleaning, and/or removal of the material or photoresist as required in forming a described structure. As will be evident from context, the term "integrated circuit system" is defined to mean the system of manufacturing an integrated circuit in accordance with the present invention and the system of the integrated circuit manufactured by using the system of manufacturing of the present invention.

Generally the photolithography system of the present invention includes a dipole illumination system employing a multiple exposure method. As is evident to one having ordinary skill in the art, dipole illumination is commonly used to enhance the resolution of patterns with orientations perpendicular to the axes of the dipoles. For example, a dipole axis located along a first direction (e.g.—the X axis) promotes enhanced imaging of features formed along a second direction (e.g.—the Y axis), which is substantially orthogonal to the first direction; and, a dipole axis located along a second direction promotes enhanced imaging of features formed along a first direction.

Stated another way, dipole illumination is a type of off-axis illumination where two circles of light are used as the source for illuminating a mask or reticle. The two circles are spaced evenly around an optical axis of the system, and are either oriented vertically or horizontally. Dipole illumination can provide enhanced dense line resolution, but only for an orientation of lines and spaces that is perpendicular to the orientation of the two circles.

As an exemplary illustration, the photolithography system of the present invention may employ a method of imaging a pattern by performing a dipole multiple exposure technique. The first exposure is performed by a first mask and the second exposure is performed by a second mask, wherein the superposition of the images defined by the masks produces the desired structure on the target substrate. Uniquely, the present invention may employ a method wherein the image pattern of the second mask is aligned over and substantially perpendicular to the image pattern produced by the first mask to produce an overlap region that is smaller than either image pattern. Although the embodiments that follow are described in terms of a first exposure and a second exposure, it is to be understood that any number of exposure steps (i.e.—one or more) may benefit from the method and device described herein.

Each exposure step of the multiple exposure method utilizes a mask that is imaged via a dipole illumination process, wherein the axes of the dipoles are substantially perpendicular to the axes of the features formed on each mask. It is through these four effective exposures and the superposition of the images that highly defined and repeatable structure formations can be formed on the substrate. The present invention makes improvement over conventional dipole imaging techniques by utilizing a mask overlay technique that mitigates the need for optical enhancement techniques.

Referring now to FIG. 1, therein is shown an isometric view of the basic elements of a photolithography system 100 used to image a structure 136 by dipole illumination in accordance with an embodiment of the present invention. By way of example, the structure 136 may include an opening, such as a square contact hole or a circular contact hole, formed in a substrate 138. The structure 136 is defined by an additional opening, such as an overlap region 206, described further in FIG. 2, which is formed by processing a photoresist material 132 formed above the substrate 138. As an exemplary illustration, the structure 136 can be filled with a conductive material to provide an electrical interconnection between layers of an integrated circuit system 134 formed in or on the substrate 138.

The photolithography system 100 includes a radiation source 102, a radiation beam 104, an aperture plate 106, a first dipole opening 108, a second dipole opening 110, a dipole axis 112, an optical axis 114, a dipole opening outer measurement 116, a dipole opening inner measurement 118, a condenser lens 120, a mask 122, a feature 124, an opaque region 126, a major axis 128, a projection lens 130, the photoresist material 132, the integrated circuit system 134, the structure 136, and the substrate 138. Generally, the mask 122 is illuminated by the radiation beam 104 emitted from the radiation source 102 and an image of the mask 122 is projected onto the photoresist material 132, which coats the substrate 138, to form the structure 136.

The radiation source 102 may include an energy source producing a wavelength in the ultraviolet (UV), vacuum ultraviolet (VUV), deep ultraviolet (DUV), or extreme ultraviolet (EUV) range. However, the preceding examples are not to be construed as limiting, and the radiation source 102 may include any form of energy that can be propagated as waves or streams of charged particles. The radiation source 102 provides the energy necessary for promoting cross-linking or a phase change within the photoresist material 132. The energy transmitted by the radiation source 102 through the photolithography system 100 is exemplified by the radiation beam 104.

The aperture plate 106, such as a first aperture plate or a second aperture plate, orients the energy produced by the radiation source 102 to form a dipole illumination mode. The aperture plate 106 achieves this by transmitting the radiation beam 104 through the first dipole opening 108 and the second dipole opening 110. The dipole axis 112 is the axis that bisects the first dipole opening 108 and the second dipole opening 110.

Per this embodiment, the dipole axis 112 can be described as having an orientation that is parallel to a first direction, wherein the first direction is substantially perpendicular to a second direction. In accordance with the present invention, when the dipole axis 112 is formed parallel to the first direction, the photolithography system 100 will optimally image patterns, such as the feature 124, with orientations substantially perpendicular to the first direction (i.e.—formed in the second direction). However, the aperture plate 106 orientation is not to be limited to a perpendicular orientation with respect to the feature 124, and may include any orientation that produces a desired image pattern on the substrate 138.

Notably, the present invention employs off-axis illumination by forming the first dipole opening 108 and the second dipole opening 110 off the optical axis 114 of the photolithography system 100. By forming the first dipole opening 108 and the second dipole opening 110 off the optical axis 114, the incident radiation striking the mask 122 can be at an angle. As is known to a person having ordinary skill in the art, non-orthogonal radiation improves the process latitude of a photolithography system by increasing the depth of focus for imaging.

The first dipole opening 108 and the second dipole opening 110 can be of various shapes, sizes and orientations. In accordance with the scope of the present invention, the first dipole opening 108 and the second dipole opening 110 may include any geometrical design or configuration, wherein the length of the dipole opening outer measurement 116 exceeds that of the dipole opening inner measurement 118.

Furthermore, although the present invention depicts the dipole illumination effect created by the aperture plate 106, it is to be understood that other means can be employed to produce the dipole illumination effect. For example, diffractive optical elements could be employed to form the dipole illumination effect, instead of the aperture plate 106.

After the radiation beam 104 passes through the aperture plate 106, it then strikes the condenser lens 120. The condenser lens 120 helps to coalesce and/or condense the radiation transmitted through the aperture plate 106. By passing through the condenser lens 120 the radiation beam 104 is shaped and directed onto the mask 122.

The mask 122 includes the feature 124, such as a first feature or a second feature, which is a transparent opening, and the opaque region 126. As an exemplary illustration, the feature 124 may include a rectangular design or configuration. In accordance with the present invention, the major axis 128 of each of the feature 124 is formed perpendicular to the dipole axis 112. Per this embodiment, the major axis 128 is formed in the second direction.

Uniquely, the present invention employs a method wherein the shape or size of the feature 124 differs from the shape or size of the structure 136 formed on the substrate 138. For example, an image of the feature 124 may possess a geometry that is different from the structure 136 to be formed on the substrate 138. Furthermore, by way of example, an image of the feature 124 may be larger than the structure 136 to be formed on the substrate 138.

It has been discovered by the present inventors that the structure 136, such as a high quality square contact hole, can be formed in the substrate 138 by using a rectangular opening as the feature 124. However, the shape of the structure 136 is not to be limited to a square contact hole. It is to be understood that the structure 136 may include any shape or configuration formed by the overlap or intersection between an image of a first mask 202, described further in FIGS. 2, 4 and 6, and an image of a second mask 302, described further in FIGS. 3, 5 and 7. As an additional exemplary illustration, the structure 136 may further include a circular contact hole.

Figure 2:
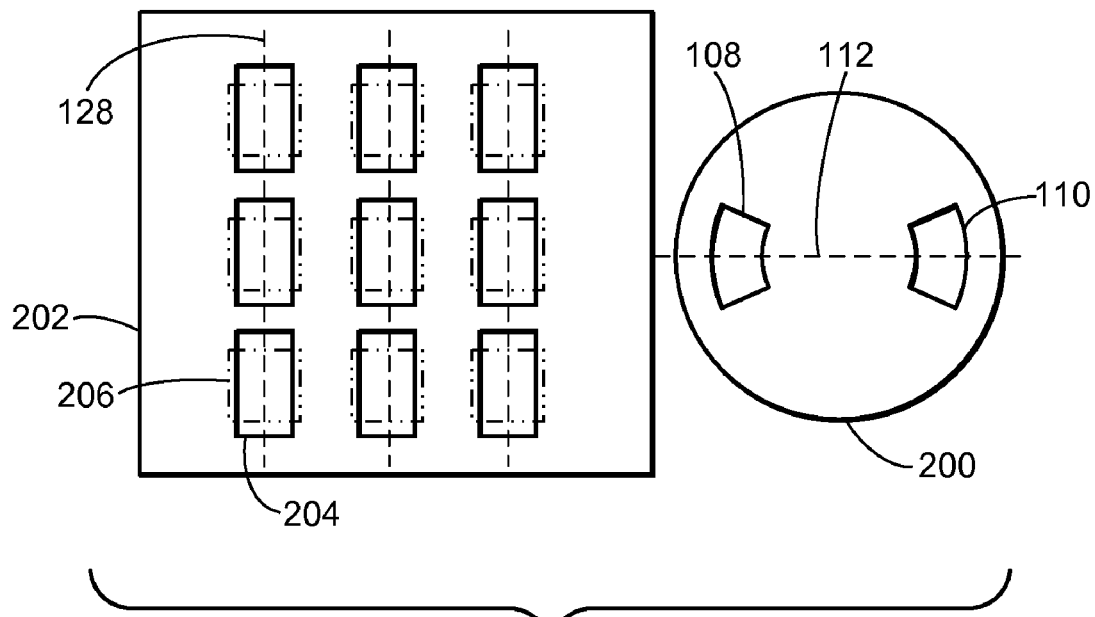
FIG. 2 is a top view of the first aperture plate and the first mask used by the photolithography system, of FIG. 1, during a first exposure step, in accordance with an embodiment to the present invention.
Figure 3:
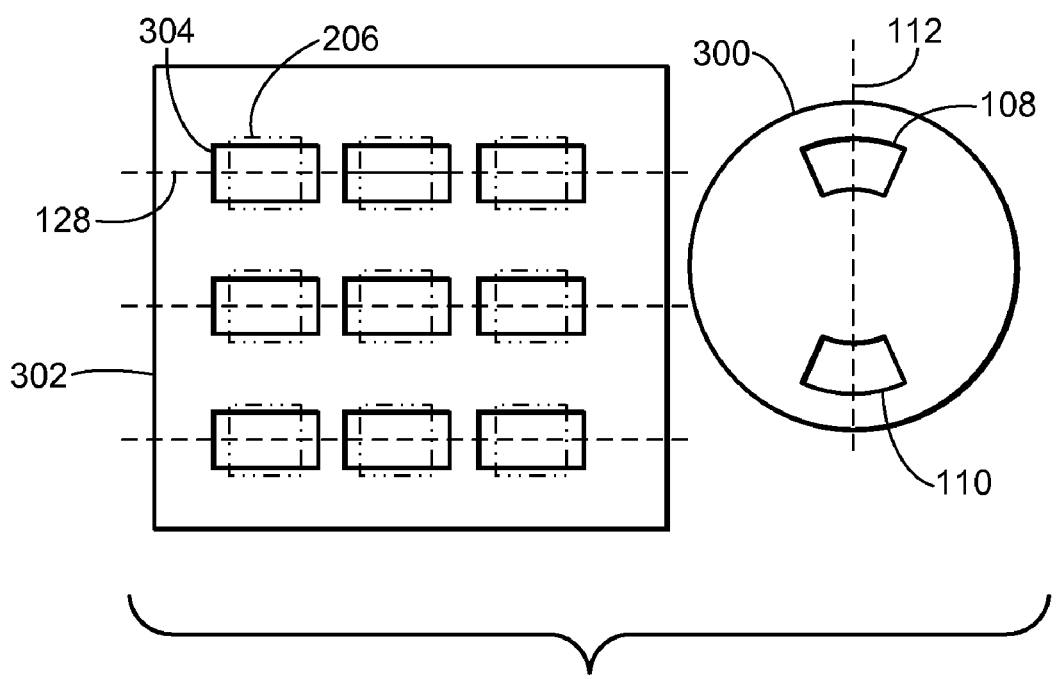
FIG. 3 is a top view of the second aperture plate and the second mask used by the photolithography system, of FIG. 1, during a second exposure step, in accordance with an embodiment to the present invention.
Figure 4:
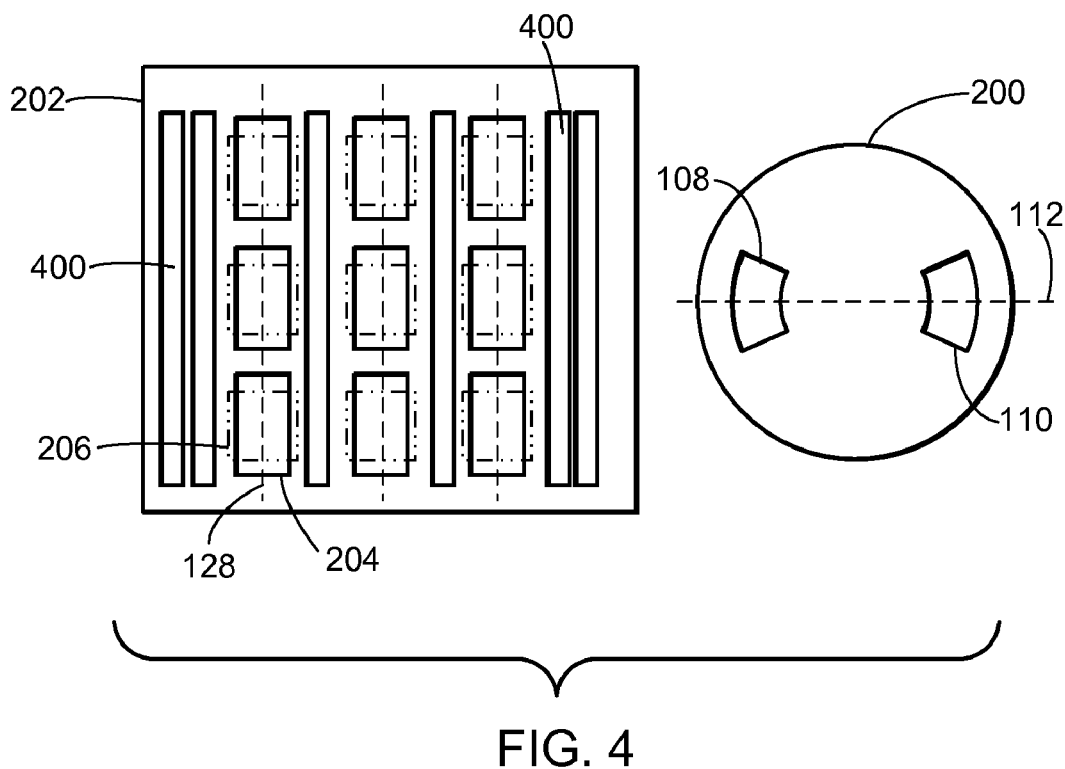
FIG. 4 is a top view of the first aperture plate and the first mask used by the photolithography system, of FIG. 1, during a first exposure step, in accordance with another embodiment to the present invention.
Figure 5:
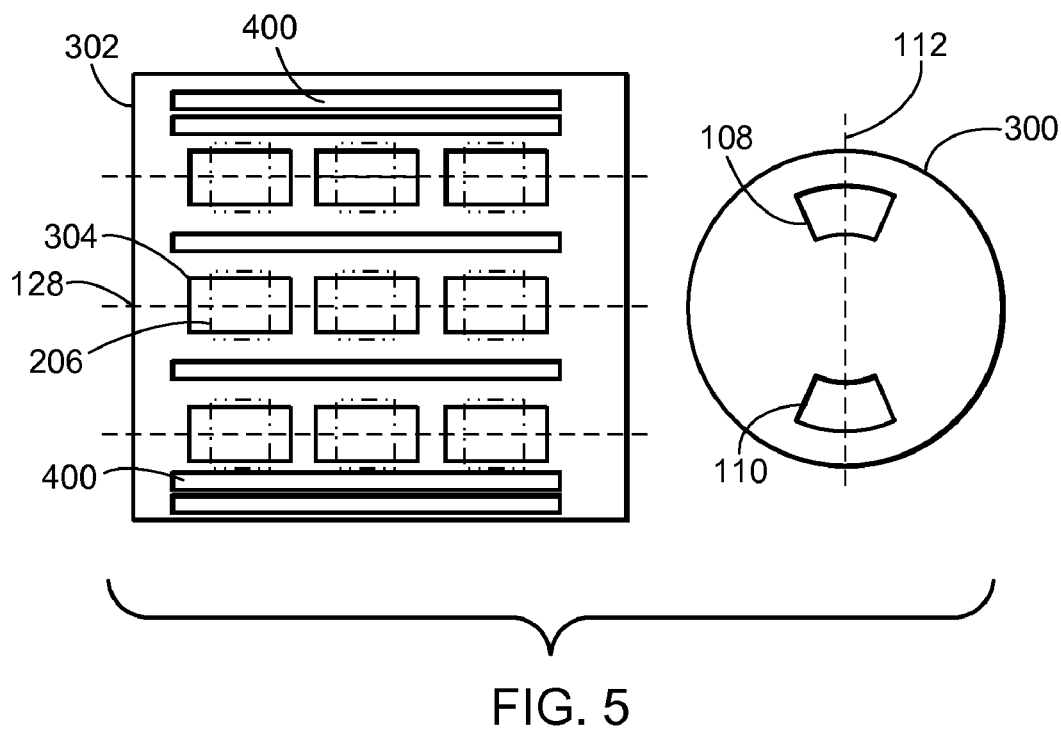
FIG. 5 is a top view of the second aperture plate and the second mask used by the photolithography system, of FIG. 1, during a second exposure step, in accordance with another embodiment to the present invention.
Figure 6:
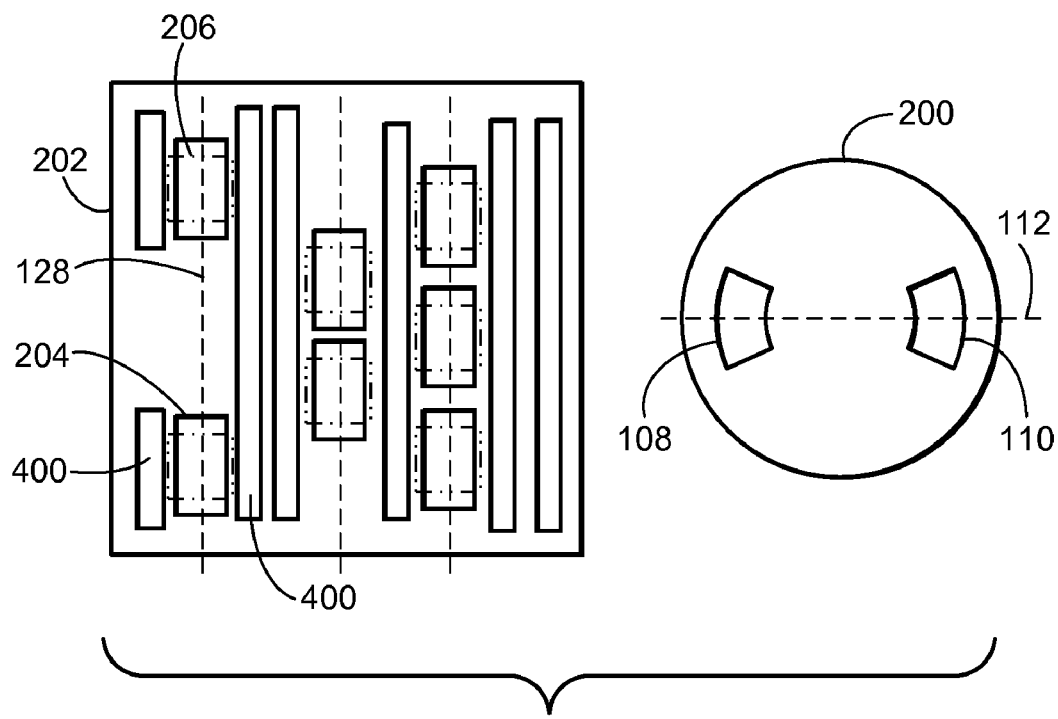
FIG. 6 is a top view of the first aperture plate and the first mask used by the photolithography system, of FIG. 1, during a first exposure step, in accordance with another embodiment to the present invention.
Figure 7:
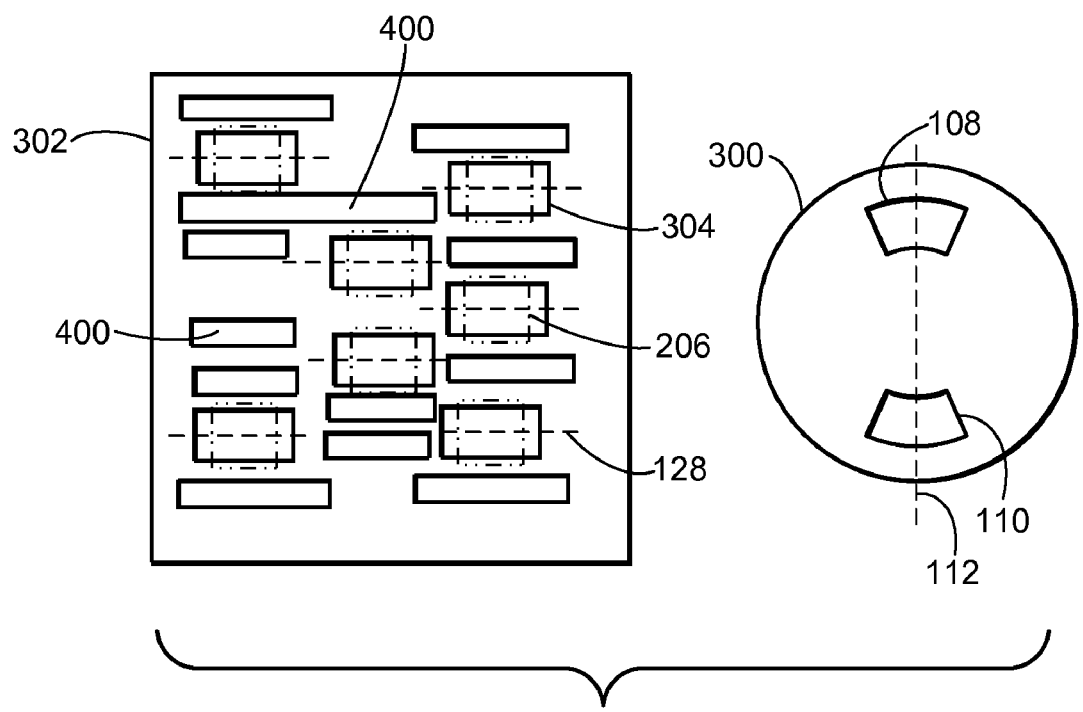
FIG. 7 is a top view of the second aperture plate and the second mask used by the photolithography system, of FIG. 1, during a second exposure step, in accordance with another embodiment to the present invention.

In part, the structure 136 can be formed by performing the imaging process in two distinct steps: a first exposure upon the first mask 202, described in FIGS. 2, 4 and 6, with a first rectangular opening and then a second exposure upon the second mask 302, described in FIGS. 3, 5 and 7, with a second rectangular opening, wherein the second rectangular opening is oriented substantially perpendicular to the first rectangular opening. These two distinct imaging steps allow the image pattern of the second rectangular opening to be aligned over and substantially perpendicular to the image pattern produced by the first exposure. As is evident from the disclosure herein, the structure 136 can be formed in the substrate 138 where the first rectangular opening image and the second rectangular opening image overlap.

The present inventors have found that by employing this overlaid substantially perpendicular rectangular exposure technique that multiple process margin aspects can be improved. The following examples are provided merely for purposes of illustration, and are not intended to limit the scope of process margin improvements.

First, separate mask exposure steps allow the photolithography system 100 to adjust the focus for each exposure, thereby ensuring optimal focus for each exposure. Separate focus adjustment capability for each exposure combined with dipole illumination enhances the ability of the photolithography system 100 to image the feature 124 within the photoresist material 132 by ensuring the largest possible depth of focus for each exposure. Secondly, size up of the feature 124 is no longer needed to form the structure 136 on the substrate 138. Size up is no longer needed because the feature 124 that forms the structure 136 on the substrate 138 is already larger than the structure 136 desired (e.g.—using a rectangular feature to form a square contact). Thirdly, the larger size of the feature 124 provides a high exposure latitude, thereby delivering a sufficient dose of energy to expose the photoresist material 132. Finally, the larger size of the feature 124 reduces the need for optical enhancement techniques. For example, by forming the feature 124 larger in size than the conventional square contact hole normally used, the present invention requires little or no mask enhancement to ameliorate the negative consequences of smaller mask openings, such as diffraction and light scattering.

As is evident from the disclosure herein, the radiation beam 104 produced by the photolithography system 100 for the first exposure step is designed to produce only partial cross-linking or a partial phase change of the photoresist material 132 located over the substrate 138. For example, the radiation incident upon the photoresist material 132 by a first exposure process should only be of enough energy to cross-link or phase change up to ninety percent (90%) of the thickness of the photoresist material 132 formed over the substrate 138. Total cross-linking or phase change of the photoresist material 132 by a first exposure process is not desired because it is the combination of the first mask 202 image pattern and the second mask 302 image pattern that produces the desired opening, such as the overlap region 206, described further in FIG. 2. Accordingly, the second dose of radiation used to expose the second mask 302 should possess enough energy to cross-link or phase change the remaining unaltered thickness of the photoresist material 132 that is defined by the overlap region 206.

Although, the present invention does not require the use of optical enhancement techniques, it is to be appreciated that other masks, which employ optical enhancement techniques may be used. For example, phase-shifting masks, reflective masks, attenuated masks, and optical proximity correction masks can be employed by the mask 122 of the present invention.

Furthermore, although the present invention is described with respect to the mask 122, it is to be understood that the mask 122 may include any device used to form a global or local pattern, such as a reticle.

After passing through the mask 122, the radiation beam 104 transmits the image pattern formed by the combination of the opaque region 126 and the feature 124 onto the photoresist material 132. But, due to diffraction caused by the feature 124, the radiation beam 104 and its orders of diffraction are best collected and transmitted by the projection lens 130.

The projection lens 130 may include any conventional design, which redirects the radiation beam 104 from the mask 122 directly onto the substrate 138. Typically, the projection lens 130 reduces the image pattern from the mask 122 by a factor of one quarter (¼) or one fifth (⅕) to meet the critical dimension demands of existing node technology.

Predictably, when the radiation beam 104 passes through the feature 124 on the mask 122, it is diffracted and separated largely into $0^{th}$ order and $1^{st}$ order spatial frequencies, due to the influence of the narrow width of the feature 124. Notably, the projection lens 130 of the present invention is able to capture more of the $1^{st}$ order spatial frequency because the $1^{st}$ order spatial frequencies angle of diffraction is reduced due to the larger size of the feature 124. Therefore, the photolithography system 100 can improve the depth of focus latitude and resolution of the image produced by the mask 122 by transmitting more of the $1^{st}$ order spatial frequency through the projection lens 130. The projection lens 130 focuses these diffracted orders of radiation that have passed through the mask 122 toward a predetermined region on the substrate 138.

At this point, the radiation beam 104 transmits the image of the mask 122 at the appropriate critical dimension size for the integrated circuit system 134 (demarcated in phantom outline). The image pattern produced by the mask 122 and transmitted by the radiation beam 104 exposes the photoresist material 132 or other light sensitive film on the substrate 138. It is to be understood that the photoresist material 132 of the present invention may include any type of resist, such as a negative tone resist, a positive tone resist, or a chemically amplified resist, for example. Furthermore, additional layers, such as a primer, a top anti-reflective coating and/or a bottom anti-reflective coating may be employed to enhance the development of the photoresist material 132.

For purposes of clarity, a circle 1 depicts an enlarged view of an area of the substrate 138 with the photoresist material 132 removed. The substrate 138 includes the integrated circuit system 134 and the structure 136.

As is evident to one having ordinary skill in the art, the integrated circuit system 134 may include the structure 136 formed by the photolithography system 100, thereby producing semiconductor chips and integrated circuit packages selected from active components, passive components, stacked components, memory components, and so forth, in numerous configurations and arrangements as may be needed. It is to be understood that the integrated circuit system 134 covers a wide range of semiconductor chip and integrated circuit package configurations involving various sizes, dimensions, and electrical contact techniques, and the type of chip or package configuration employed should only be limited by the design specifications of the integrated circuit package.

Furthermore, the substrate 138 may include a printed wiring board or a semiconductor substrate; however, the substrate 138 is not to be limited to these examples. In accordance with the scope of the present invention, the substrate 138 may include any medium on or in which integrated circuits are fabricated. Additionally, the body of material chosen for the substrate 138 can be selected from ceramics, silicon, silicon based composites, semiconducting materials other than silicon, plastics, or laminates of various types (organic or inorganic), which are compatible chemically, thermally, and mechanically with the process conditions chosen for the integrated circuit system 134. Moreover, it is to be understood that one or more of the integrated circuit system 134 can be prepared at one time on the substrate 138, which could then be separated into individual or multiple semiconductor assemblies at a later stage of fabrication.

The remaining process steps, such as post-exposure bake, develop, hard bake, develop inspect, etch and/or deposit are well known within the art and not repeated herein.

FIGS. 2 and 3, which follow, depict similar configurations and elements as to that shown in FIG. 1, and consequently, only the differences between the figures will be described, to avoid redundancy. Furthermore, FIGS. 2 and 3 depict a sequence of steps; however, it is to be understood that the order of the steps depicted by FIGS. 2 and 3 is without moment and one may precede the other without consequence. Moreover, it is to be understood that the aperture plate 106, of FIG. 1, generically describes the first aperture plate 200, of FIG. 2, and a second aperture plate 300, of FIG. 3; the mask 122, of FIG. 1, generically describes the first mask 202, of FIG. 2, and the second mask 302, of FIG. 3; and the feature 124, of FIG. 1, generically describes the first feature 204, of FIG. 2, and a second feature 304, of FIG. 3.

Additionally, per the embodiments of FIGS. 2 and 3, the first mask 202 and the second mask 302 depicted can be used to form a dense repetitive pattern of the structure 136, of FIG. 1, such as in a core region of the integrated circuit system 134, of FIG. 1. The pattern of the first feature 204 and the second feature 304 formed on the first mask 202 and the second mask 302, respectively, may include a locally or globally periodic configuration. The first mask 202 and the second mask 302 can be designed to print a dense array of the structure 136, via the overlap region 206, near the resolution limit of the photolithography system 100, of FIG. 1. For example, the pitch of adjacent ones of the structure 136 may range from about 270 nanometers to about 120 nanometers, thereby including the 60 nanometer technology node. However, it is to be appreciated that as the radiation source 102, of FIG. 1, incorporates energy of shorter wavelengths, such as extreme ultraviolet, that the photolithography system 100 may benefit from the method and device described herein and enable further pitch reduction.

Referring now to FIG. 2, therein is shown a top view of the first aperture plate 200 and the first mask 202 used by the photolithography system 100, of FIG. 1, during a first exposure step, in accordance with an embodiment to the present invention. For ease of discussion, this portion of the process can generally be referred to as a first exposure step performed on the first mask 202. The first aperture plate 200 includes the first dipole opening 108, the second dipole opening 110 and the dipole axis 112. The dipole axis 112 of the first aperture plate 200 is oriented along a first direction. Pursuant to the convention of the present invention, the first direction can also be referred to as an X-axis orientation. As is evident to one having ordinary skill in the art, when the dipole axis 112 is oriented along the first direction, the first aperture plate 200 produces an illumination mode that is optimal for imaging a pattern parallel to the second direction, which is substantially orthogonal to the first direction.

The first mask 202 includes the first feature 204, wherein the major axis 128 of the first feature 204 is oriented parallel to the second direction, which can also be referred to as a Y-axis orientation. Pursuant to this embodiment, the first mask 202 images a pattern on the substrate 138, of FIG. 1, that is oriented substantially perpendicular to the dipole axis 112. As an exemplary illustration, the first feature 204 may include a rectangular opening; however, it is not to be limited to this shape and the first feature 204 may include any geometrical configuration.

The structure 136, of FIG. 1, imaged on the substrate 138 is represented by the overlap region 206, which is depicted in phantom outline. The overlap region 206, which is the opening in the photoresist material 132, of FIG. 1, defining the structure 136, represents the area of the substrate 138 that receives a dose of energy from the first exposure step and from the second exposure step, described further in FIG. 3. Stated another way, the overlap region 206 represents the area of overlap or intersection between the first mask 202 image and the second mask 302, described further in FIG. 3, image.

The present invention depicts a 3×3 array of the first feature 204; however, this configuration should not be construed as limiting. In accordance with the scope of the present invention, the first mask 202 may possess any number of the first feature 204 and they may be arranged in any configuration as desired by the design engineer.

Referring now to FIG. 3, therein is shown a top view of the second aperture plate 300 and the second mask 302 used by the photolithography system 100, of FIG. 1, during a second exposure step, in accordance with an embodiment of the present invention. For ease of discussion, this portion of the process can generally be referred to as a second exposure step performed on the second mask 302. The second aperture plate 300 of the present embodiment includes the first dipole opening 108, the second dipole opening 110 and the dipole axis 112. The dipole axis 112 of the second aperture plate 300 is oriented along a second direction. Pursuant to the convention of the present invention, the second direction can also be referred to as a Y-axis orientation. As is evident to one having ordinary skill in the art, when the dipole axis 112 is oriented along the second direction, the second aperture plate 300 produces an illumination mode that is optimal for imaging a pattern parallel to the first direction, which is substantially orthogonal to the second direction.

The second mask 302 includes the second feature 304, wherein the major axis 128 of the second feature 304 is oriented parallel to the first direction, which can also be referred to as an X-axis orientation. Pursuant to this embodiment, the second mask 302 images a pattern on the substrate 138, of FIG. 1, that is oriented substantially perpendicular to the dipole axis 112. As an exemplary illustration, the second feature 304 may include a rectangular opening; however, it is not to be limited to this shape and the second feature 304 may include any geometrical configuration.

The structure 136, of FIG. 1, imaged on the substrate 138 is represented by the overlap region 206, which is depicted in phantom outline. The overlap region 206 is an opening in the photoresist material 132, of FIG. 1, formed by aligning the image of the second feature 304 over the image of the first feature 204, of FIG. 2.

Although, the above embodiments depicted by FIGS. 2 and 3 described the formation of the structure 136 as a square contact formed by rectangular opening geometries, it is not to be construed as limiting. In accordance with the scope of the present invention, it is to be understood that the structure 136 may also include different shapes formed by using different mask opening geometries.

FIGS. 4 and 5, which follow, depict similar configurations and elements as to that shown in FIGS. 1-3, and consequently, only the differences between the figures will be described, to avoid redundancy. Furthermore, FIGS. 4 and 5 depict a sequence of steps; however, it is to be understood that the order of the steps depicted by FIGS. 4 and 5 is without moment and one may precede the other without consequence. Moreover, it is to be understood that the aperture plate 106, of FIG. 1, generically describes the first aperture plate 200, of FIG. 4, and the second aperture plate 300, of FIG. 5; the mask 122, of FIG. 1, generically describes the first mask 202, of FIG. 4, and the second mask 302, of FIG. 5; and the feature 124, of FIG. 1, generically describes the first feature 204, of FIG. 4, and the second feature 304, of FIG. 5.

Referring now to FIG. 4, therein is shown a top view of the first aperture plate 200 and the first mask 202 used by the photolithography system 100, of FIG. 1, during a first exposure step, in accordance with another embodiment to the present invention. The first aperture plate 200 includes the first dipole opening 108, the second dipole opening 110 and the dipole axis 112. The dipole axis 112 of the first aperture plate 200 is oriented along a first direction.

Per this embodiment, the first mask 202 now includes a sub-resolution assist feature 400, which can be oriented parallel to the major axis 128 of the first feature 204 (i.e.—that is parallel to the second direction). The sub-resolution assist feature 400 is designed to improve the process margin of the image formed by the first feature 204 on the substrate 138, of FIG. 1. Typically, the sub-resolution assist feature 400 is rectangular in shape and is positioned adjacent to an edge of the first feature 204 in order to improve the contrast of the image produced by the first feature 204 on the substrate 138. The sub-resolution assist feature 400 is characteristically designed such that it does not print on the substrate 138.

Uniquely, the present embodiment employs the sub-resolution assist feature 400 formed as a long assist slot, which requires little data handling. For example, since the optical proximity effects of the first feature 204 are based on the nature of its geometry, which are the same for each of the first feature 204 (e.g.—a rectangular opening), the design and placement of the sub-resolution assist feature 400 can easily be calculated. This is in direct contrast to conventional print bias methods, which involve sophisticated algorithms of very large data size, to accommodate a multitude of different corrections, such as serifs, required for each separation distance between various patterns.

Furthermore, the present invention may employ software to analyze the data for a pattern created by the first feature 204 and the sub-resolution assist feature 400 on the first mask 202, and estimate how that pattern will print on the first mask 202. Additionally, the software can apply a set of design rules to determine if the number, design, size and placement of the sub-resolution assist feature 400 are acceptable. For example, the software may apply a set of design rules to determine if the number, design, size and placement of the sub-resolution assist feature 400 on the first mask 202 are acceptable to yield a satisfactory pattern on the substrate 138. Depending upon the result, the data for the first mask 202 pattern or portions thereof may be adjusted (e.g.—by adjusting the number, design, size and placement of the sub-resolution assist feature 400) such that the pattern created on the substrate 138 will be optimized for resolution purposes.

Although the present embodiment depicts six of the sub-resolution assist feature 400 formed on the first mask 202, it is not to be construed as limiting. In accordance with the scope of the present embodiment, the first mask 202 may include any number of the sub-resolution assist feature 400, which promotes enhanced resolution of the first feature 204 on the substrate 138.

The overlap region 206 represents the structure 136, of FIG. 1, formed on the substrate 138 and the area of overlap or intersection between the first mask 202 image and the second mask 302, of FIG. 5, image within the photoresist material 132, of FIG. 1.

Referring now to FIG. 5, therein is shown a top view of the second aperture plate 300 and the second mask 302 used by the photolithography system 100, of FIG. 1, during a second exposure step, in accordance with another embodiment of the present invention. The second aperture plate 300 includes the first dipole opening 108, the second dipole opening 110 and the dipole axis 112. The dipole axis 112 of the second aperture plate 300 is oriented along a second direction.

Per this embodiment, the second mask 302 now includes the sub-resolution assist feature 400, which can be oriented parallel to the major axis 128 of the second feature 304 (i.e.—that is parallel to the first direction).

Typically, the sub-resolution assist feature 400 is rectangular in shape and is positioned adjacent to an edge of the second feature 304 in order to improve the contrast of the image produced by the second feature 304 on the substrate 138, of FIG. 1. The sub-resolution assist feature 400 is typically designed such that it does not print on the substrate 138.

Uniquely, the present embodiment employs the sub-resolution assist feature 400 formed as a long assist slot, which requires little data handling. For example, since the optical proximity effects of the second feature 304 are based on the nature of its geometry, which are the same for each of the second feature 304 (e.g.—a rectangular opening), the design and placement of the sub-resolution assist feature 400 can easily be calculated.

Furthermore, the present invention may employ software to analyze the data for a pattern created by the second feature 304 and the sub-resolution assist feature 400 on the second mask 302, and estimate how that pattern will print on the second mask 302. Additionally, the software can apply a set of design rules to determine if the number, design, size and placement of the sub-resolution assist feature 400 are acceptable. For example, the software may apply a set of design rules to determine if the number, design, size and placement of the sub-resolution assist feature 400 on the second mask 302 are acceptable to yield a satisfactory pattern on the substrate 138. Depending upon the result, the data for the second mask 302 pattern or portions thereof may be adjusted (e.g.—by adjusting the number, design, size and placement of the sub-resolution assist feature 400) such that the pattern created on the substrate 138 will be optimized for resolution purposes.

Although the present embodiment depicts six of the sub-resolution assist feature 400 formed on the second mask 302, it is not to be construed as limiting. In accordance with the scope of the present embodiment, the second mask 302 may include any number of the sub-resolution assist feature 400, which promotes enhanced resolution of the second feature 304 on the substrate 138.

Furthermore, although the present embodiment, as illustrated by FIGS. 4 and 5, depicts the sub-resolution assist feature 400 as a long assist slot that traverses the entire length of the pattern formed on the first mask 202 and the second mask 302 by the first feature 204 and the second feature 304, respectively, it is to be understood that the sub-resolution assist feature 400 may include any length that is greater or less than the pattern formed on the first mask 202 and the second mask 302.

The overlap region 206 represents the structure 136, of FIG. 1, formed on the substrate 138 and the area of overlap or intersection between the first mask 202, of FIG. 4, image and the second mask 302 image within the photoresist material 132, of FIG. 1.

FIGS. 6 and 7, which follow, depict similar configurations and elements as to that shown in FIGS. 1-5, and consequently, only the differences between the figures will be described, to avoid redundancy. Furthermore, FIGS. 6 and 7 depict a sequence of steps; however, it is to be understood that the order of the steps depicted by FIGS. 6 and 7 is without moment and one may precede the other without consequence. Moreover, it is to be understood that the aperture plate 106, of FIG. 1, generically describes the first aperture plate 200, of FIG. 6, and the second aperture plate 300, of FIG. 7; the mask 122, of FIG. 1, generically describes the first mask 202, of FIG. 6, and the second mask 302, of FIG. 7; and the feature 124, of FIG. 1, generically describes the first feature 204, of FIG. 6, and the second feature 304, of FIG. 7.

Referring now to FIG. 6, therein is shown a top view of the first aperture plate 200 and the first mask 202 used by the photolithography system 100, of FIG. 1, during a first exposure step, in accordance with another embodiment to the present invention. The first aperture plate 200 includes the first dipole opening 108, the second dipole opening 110 and the dipole axis 112. The dipole axis 112 of the first aperture plate 200 is oriented along a first direction.

Per this embodiment, the first mask 202 now includes the sub-resolution assist feature 400 and a random arrangement for the first feature 204, such as in a peripheral region of the integrated circuit system 134, of FIG. 1. In accordance with the present embodiment, it is to be understood that the random arrangement of the first feature 204 may include any configuration or arrangement of one or more of the first feature 204. For example, the random arrangement of the first feature 204 can range in density from a regular string of the first feature 204 with a minimum pitch to fully isolated ones of the first feature 204.

The sub-resolution assist feature 400 can be oriented parallel to the major axis 128 of the first feature 204 (i.e.—that is parallel to the second direction). Furthermore, the present embodiment includes the sub-resolution assist feature 400 formed to any length that does not exceed the perimeter of the first mask 202. As illustrated, the sub-resolution assist feature 400 may traverse the entire length of the pattern formed by the first feature 204 or it may merely traverse the length of one of the first feature 204. However, it is to be understood that each of the sub-resolution assist feature 400 may include any length that optimally produces the image pattern of the first mask 202 on the substrate 138, of FIG. 1, without exceeding the perimeter of the first mask 202.

The overlap region 206 represents the structure 136, of FIG. 1, formed on the substrate 138 and the area of overlap or intersection between the first mask 202 image and the second mask 302, of FIG. 7, image within the photoresist material 132, of FIG. 1.

Referring now to FIG. 7, therein is shown a top view of the second aperture plate 300 and the second mask 302 used by the photolithography system 100, of FIG. 1, during a second exposure step, in accordance with another embodiment to the present invention. The second aperture plate 300 includes the first dipole opening 108, the second dipole opening 110 and the dipole axis 112. The dipole axis 112 of the second aperture plate 300 is oriented along a second direction.

Per this embodiment, the second mask 302 now includes the sub-resolution assist feature 400 and a random arrangement for the second feature 304. In accordance with the present embodiment, it is to be understood that the pattern formed by the second feature 304 is created by rotating each of the first feature 204, of FIG. 6, ninety degrees (90°) around its midpoint. By rotating the first feature 204 ninety degrees around its midpoint, the major axis 128 of the second feature 304 is formed orthogonal to the major axis 128, of FIG. 6, of the first feature 204.

The sub-resolution assist feature 400 can be oriented parallel to the major axis 128 of the second feature 304 (i.e.—that is parallel to the first direction). As illustrated, the sub-resolution assist feature 400 may traverse the length of one or more of the second feature 304. However, it is to be understood that each of the sub-resolution assist feature 400 may include any length that optimally produces the image pattern of the second mask 302 on the substrate 138, of FIG. 1.

The overlap region 206 represents the structure 136, of FIG. 1, formed on the substrate 138 and the area of overlap or intersection between the first mask 202, of FIG. 6, image and the second mask 302 image within the photoresist material 132, of FIG. 1.

Figure 8:
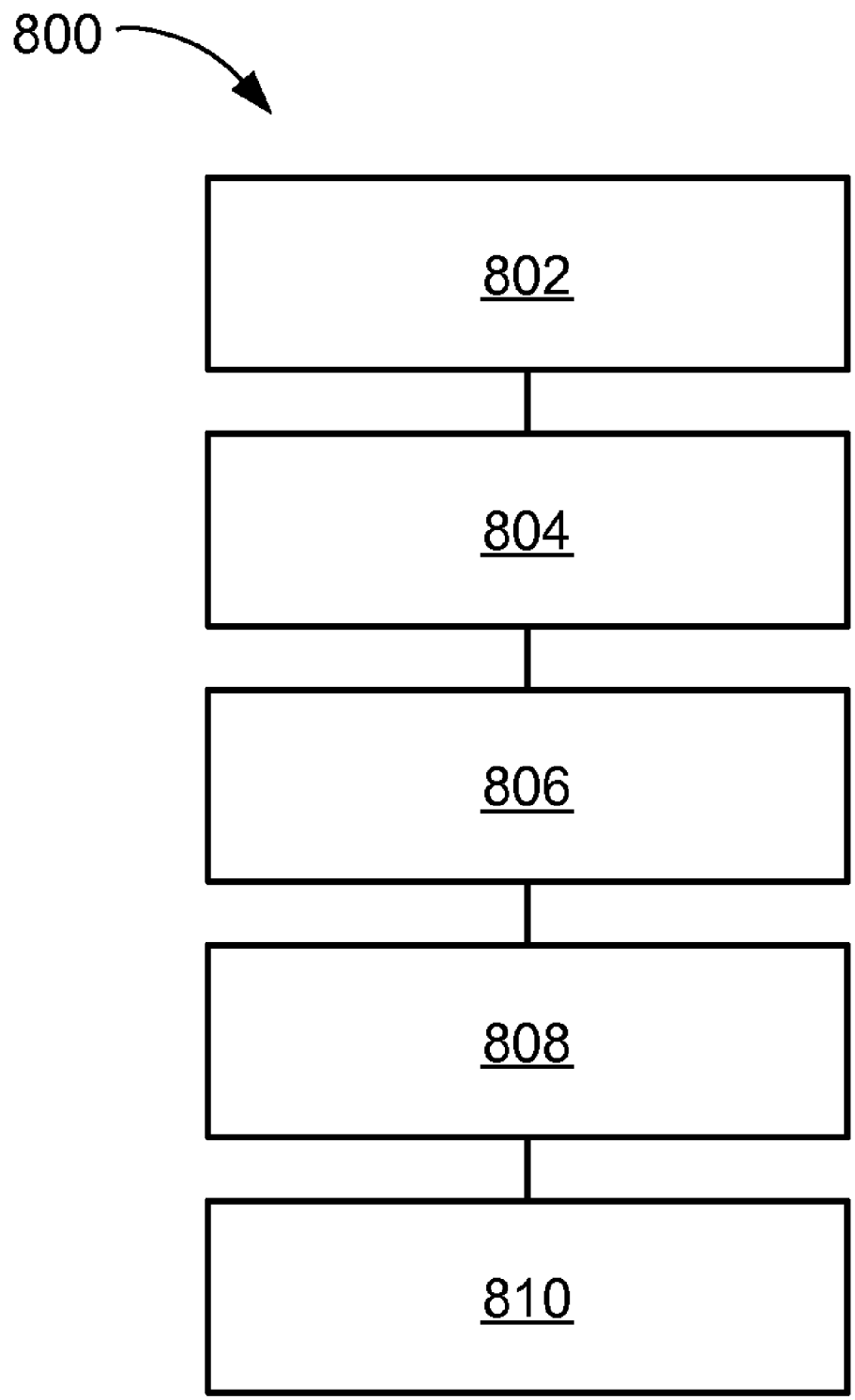
FIG. 8 is a flow chart of an integrated circuit system for an integrated circuit system, in accordance with an embodiment of the present invention.

Referring now to FIG. 8, therein is shown a flow chart of an integrated circuit system 800 for the integrated circuit system 134 in accordance with an embodiment of the present invention. The integrated circuit system 800 includes providing a first mask including a first feature in a block 802; exposing the first mask to a radiation source to form an image of the first feature on a photoresist material that is larger than a structure to be formed, the photoresist material being formed over a substrate that includes the integrated circuit system in a block 804; providing a second mask including a second feature in a block 806; aligning the second mask over the image of the first mask to form an overlap region in a block 808; and exposing the second mask to the radiation source to form an image of the second feature on the photoresist material that is larger than the structure to be formed in a block 810.

It has been discovered that the present invention thus has numerous aspects. One such aspect is that the present invention employs a dipole illumination mode. By employing a dipole illumination mode the resolution and depth of focus of the photolithography system can be improved.

Another aspect of the present invention is that it includes separate mask exposure steps, which allows the photolithography system to adjust the focus for each exposure, thereby ensuring optimal focus for each exposure. Separate focus adjustment capability for each exposure combined with dipole illumination enhances the ability of the photolithography system to image the structure, via an overlap region, by ensuring the largest possible depth of focus for each exposure.

Another aspect of the present invention is that size up of the feature is no longer needed to form the structure on the substrate. Size up is no longer needed because the feature that forms the structure on the substrate is already larger than the structure desired (e.g.—using a rectangular feature to form a square structure or circular structure).

Another aspect of the present invention is that the larger size of the feature provides a high exposure latitude, thereby delivering a sufficient dose of energy to expose the photoresist material.

Another aspect of the present invention is that the larger size of the feature reduces the need for optical enhancement techniques.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit system of the present invention furnishes important and heretofore unknown and unavailable solutions, capabilities, and functional aspects for enhancing electrical contact formations. The resulting processes and configurations are straightforward, cost-effective, uncomplicated, highly versatile and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. An integrated circuit system comprising:
providing a first aperture plate including a first dipole opening and a second dipole opening oriented in a first direction;
providing a first mask including a first feature oriented in a second direction;
exposing the first mask to a radiation source to form an image of the first feature on a photoresist material that possesses a geometry that is different from a structure to be formed on a substrate that includes the integrated circuit system;

providing a second aperture plate including the first dipole opening and the second dipole opening oriented in a second direction;

providing a second mask including a second feature oriented in a first direction, the first direction being substantially perpendicular to the second direction;

aligning the second mask over the image of the first mask; and exposing the second mask to the radiation source to form an overlap region in the photoresist material and to define the structure on the substrate.

2. The system as claimed in claim 1 further comprising:
configuring the second feature to possess a geometry that is different from the structure to be formed on the substrate.

3. The system as claimed in claim 1 further comprising:
configuring the first mask and the second mask to include a dense array pattern and a random pattern.

4. The system as claimed in claim 1 further comprising:
configuring the first mask and the second mask to include a sub-resolution assist feature.

5. The system as claimed in claim 1 wherein:
configuring the first mask and the second mask to include optical enhancement techniques.

6. An integrated circuit system comprising:
providing a first mask including a first feature;
exposing the first mask to a radiation source to form an image of the first feature on a photoresist material that is larger than a structure to be formed, the photoresist material being formed over a substrate that includes the integrated circuit system;

providing a second mask including a second feature;
aligning the second mask over the image of the first mask to form an overlap region and an unoverlapped region; and exposing the second mask to the radiation source to form an image of the second feature on the photoresist material that is larger than the structure to be formed.

7. The system as claimed in claim 6 wherein:
exposing the first mask to the radiation source and exposing the second mask to the radiation source includes exposing the first mask and the second mask to dipole illumination.

8. The system as claimed in claim 6 further comprising:
configuring the first feature and the second feature to include rectangular openings.

9. The system as claimed in claim 6 further comprising:
configuring the first mask and the second mask to include a sub-resolution assist feature.

10. The system as claimed in claim 6 wherein:
exposing the first mask to the radiation source causes a partial phase change in the photoresist material and exposing the second mask to the radiation source causes a total phase change to an area of the photoresist material defined by the overlap region.

* * * * *